(12) United States Patent
Zhong

(10) Patent No.: US 11,849,563 B2
(45) Date of Patent: Dec. 19, 2023

(54) FAN CAGE AND FAN MODULE AND ELECTRONIC DEVICE INCLUDING THE SAME

(71) Applicant: WISTRON CORP., New Taipei (TW)

(72) Inventor: Yong-Qing Zhong, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 17/720,563

(22) Filed: Apr. 14, 2022

(65) Prior Publication Data
US 2023/0240040 A1    Jul. 27, 2023

(30) Foreign Application Priority Data

Jan. 21, 2022  (CN) .......................... 202210074034.X

(51) Int. Cl.
*H05K 7/20* (2006.01)

(52) U.S. Cl.
CPC ..... *H05K 7/20172* (2013.01); *H05K 7/20736* (2013.01)

(58) Field of Classification Search
CPC .................. H05K 7/20172; H05K 7/20736
See application file for complete search history.

(56) References Cited

U.S. PATENT DOCUMENTS

| 9,157,457 | B2 | 10/2015 | Hou et al. | |
| 11,572,896 | B2 * | 2/2023 | Lu ......................... | F04D 29/601 |
| 2008/0304234 | A1 * | 12/2008 | Franz ................. | H05K 7/20172 |
| | | | | 361/695 |

FOREIGN PATENT DOCUMENTS

TW            I494043 B        7/2015

OTHER PUBLICATIONS

TW Office Action dated Dec. 8, 2022 in Taiwan application No. 111106347.

* cited by examiner

*Primary Examiner* — Mukundbhai G Patel
(74) *Attorney, Agent, or Firm* — McClure, Qualey & Rodack, LLP

(57) ABSTRACT

A fan cage, a fan module, and an electronic device are provided, where the fan cage includes a cage body having two surfaces and at least two ventilation ports and a latching mechanism arranged at the cage body, the two surfaces are located opposite to each other, the two ventilation ports are respectively located at the two surfaces, the latching mechanism is arranged at the cage body and comprises at least one latch movably protruding outwardly from one of the two surfaces.

23 Claims, 10 Drawing Sheets

FAN CAGE AND FAN MODULE AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210074034.X filed in China on Jan. 21, 2022, the entire contents of which are hereby incorporated by reference.

TECHNICAL FIELD

The disclosure relates to a fan cage, more particularly to a fan cage and a fan module and an electronic device including the same.

BACKGROUND

Devices or modules in a server are generally preferred to be detachable in order to facilitate works, such as maintenance and function expansion. For example, a server casing often provides a fan carrier that can accommodate a set of fan cages with one or more fans therein, the fan cages are detachably and can be arranged in line in the fan carrier, and the fan carrier can be detachably installed in the server casing, such that the fans can be arranged in an array and placed in a specific area of the interior of the server, such that these fans are able to produce a required airflow distribution.

In most cases, the fan cages are arranged side by side in a compact manner for the purpose of higher utilization of space, thus the lateral interval among the fan cages may be too short for them to have a reliable engagement with the partition panels therebetween. As a result, a conventional fan cage may only have a latch at one side thereof for engaging with the partition panels, which leads to an unstable installation and thus the vibration or external force or impact will easily cause the fan cages to go out of position.

This issue might be more severe when the weight on the fan cage increases. In specific, when each fan cage accommodates two or more fans stacked on each other, but the weight of the fans and the fan cage will make the fan cage more vulnerable to resist the vibration or external impact.

SUMMARY

Accordingly, one aspect of the disclosure is to provide a fan cage, a fan module, and an electronic device which are capable of securing the installation of an array of fans in a compact space.

One embodiment of the disclosure provides a fan cage including a cage body having two surfaces and at least two ventilation ports and a latching mechanism arranged at the cage body, the two surfaces are located opposite to each other, the two ventilation ports are respectively located at the two surfaces, the latching mechanism is arranged at the cage body and comprises at least one latch movably protruding outwardly from one of the two surfaces.

Another embodiment of the disclosure provides a fan module adapted for accommodating at least one fan and comprising a carrier and a plurality of fan cages. The carrier comprises a cage body and a plurality of partition boards, the plurality of partition boards are located in the cage body so as to define a plurality of accommodation spaces. The plurality of fan cages are respectively removably accommodated in the plurality of accommodation spaces, the plurality of fan cages are respectively configured for accommodating the at least one fan, each of the plurality of fan cages comprises a cage body and a latching mechanism. The cage body has two surfaces and at least two ventilation ports, the two surfaces are located opposite to each other, the two ventilation ports are respectively located at the two surfaces and are configured to correspond to the at least one fan. The latching mechanism is arranged at the cage body and comprises at least one latch movably protruding outwardly from one of the two surfaces.

Another embodiment of the disclosure provides an electronic device adapted for accommodating at least one fan and comprising a casing and a fan module, the fan module comprises a carrier and a plurality of fan cages. The carrier comprises a cage body, a plurality of partition boards, and at least one engagement hole, the cage body is removably accommodated in the casing, the plurality of partition boards are located in the cage body so as to define a plurality of accommodation spaces, the at least one engagement hole are arranged at at least one of the cage body and the plurality of partition boards. The plurality of fan cages are respectively removably accommodated in the plurality of accommodation spaces, the plurality of fan cages are respectively configured for accommodating the at least one fan, each of the plurality of fan cages comprises cage body and a latching mechanism. The cage body has two surfaces and at least two ventilation ports, the two surfaces are located opposite to each other, the two ventilation ports are respectively located at the two surfaces and are configured to correspond to the at least one fan. The latching mechanism is arranged at the cage body and comprises at least one latch movably protruding outwardly from one of the two surfaces and removably engaged with the at least one engagement hole.

According to the fan cage, the fan module, and the electronic device as discussed in the above embodiments of the disclosure, the latching mechanism provides at least one latch configured to engage at least one side of the cage body of the fan cage with the carrier, thus the fan cage can have a firm connection with the carrier, such that the fan cage is prevented from loosening and displacing away from the predetermined position due to vibration or external force or impact while accommodating more than one fan.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
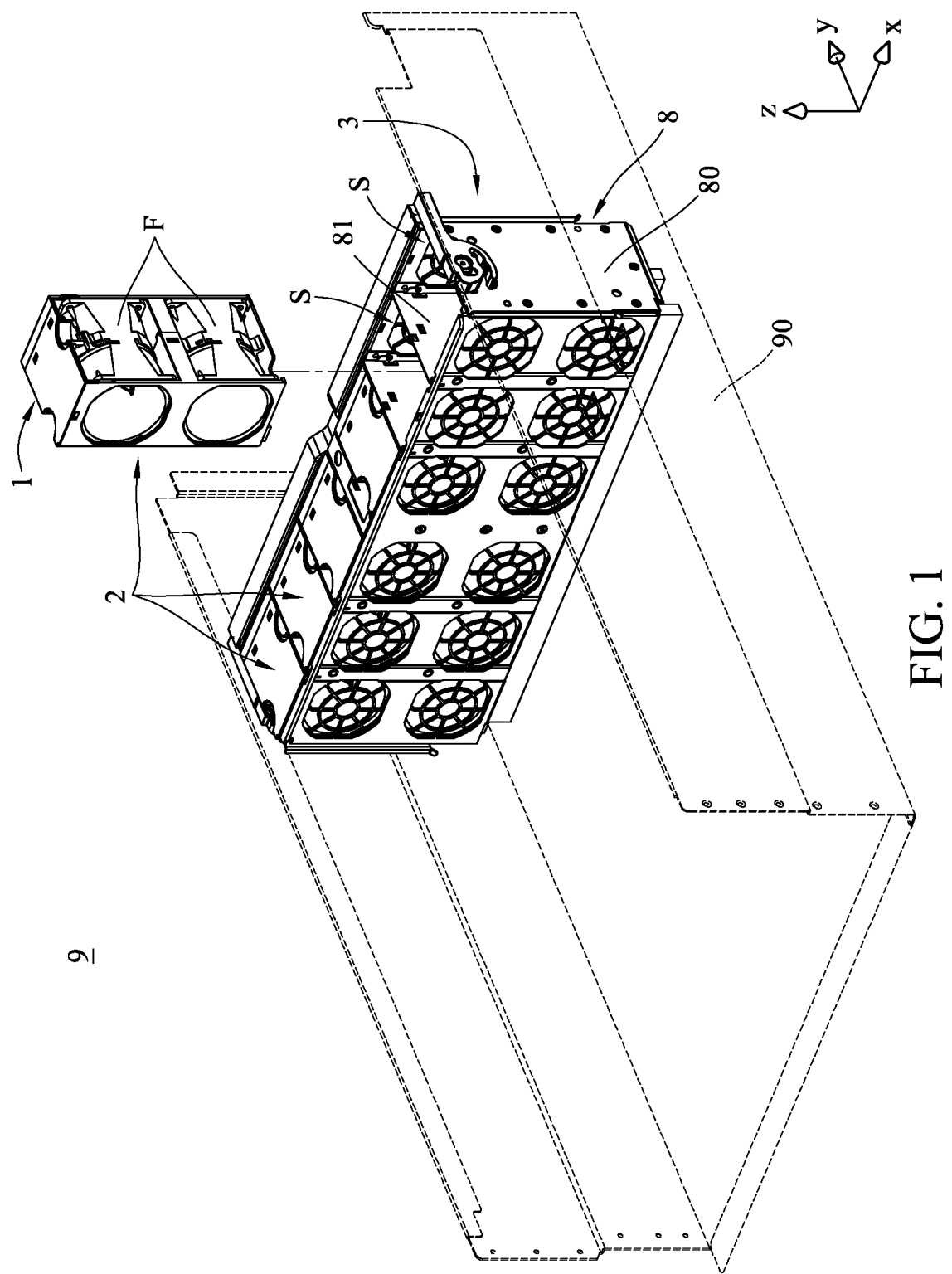
FIG. 1 is a perspective view of an electronic device according to one embodiment of the disclosure when one of fan sets is not yet installed in a carrier.

Firstly, referring to FIG. 1, one embodiment of the disclosure provides a fan cage 1, a plurality of fan sets 2 including one or more of the fan cage 1, a fan module 3 including a plurality of the fan sets 2, and an electronic device 9 including the fan module 3. The electronic device 9 may be but not limited to be a computer or a server. The electronic device 9 may include a casing 90. The casing 90 is configured to accommodate one or more of the fan module 3 and other associated devices and electrical components (not shown). The fan module 3 may include a carrier 8. The carrier 8 is configured to be removably or detachably accommodated in the casing 90, but the disclosure is not limited thereto. The carrier 8 may include a carrier body 80 and at least one partition board 81. The partition boards 81 are accommodated within the carrier body 80 and are spaced apart from each other so as to define a plurality of accommodation spaces S which are respectively suitable for accommodating the fan sets 2. As shown, the carrier 8 may accommodate a plurality of fan sets 2 arranged in an array of 1×6. The fan sets 2 may each include one fan cage 1 and at least one fan F suitably accommodated in the fan cage 1. As shown, one fan cage 1 may accommodate a plurality of fans F arranged in an array of 2×1. The fan F may be but not limited to be any typical fan, but the disclosure is not limited by the fan F and its configuration.

An array of fans F is allowed to be firmly installed in the carrier 8 of the fan module 3 through the fan cage 1, such that the fans F can be arranged in the predetermined position in the casing 90 with the carrier 8.

Figure 2:
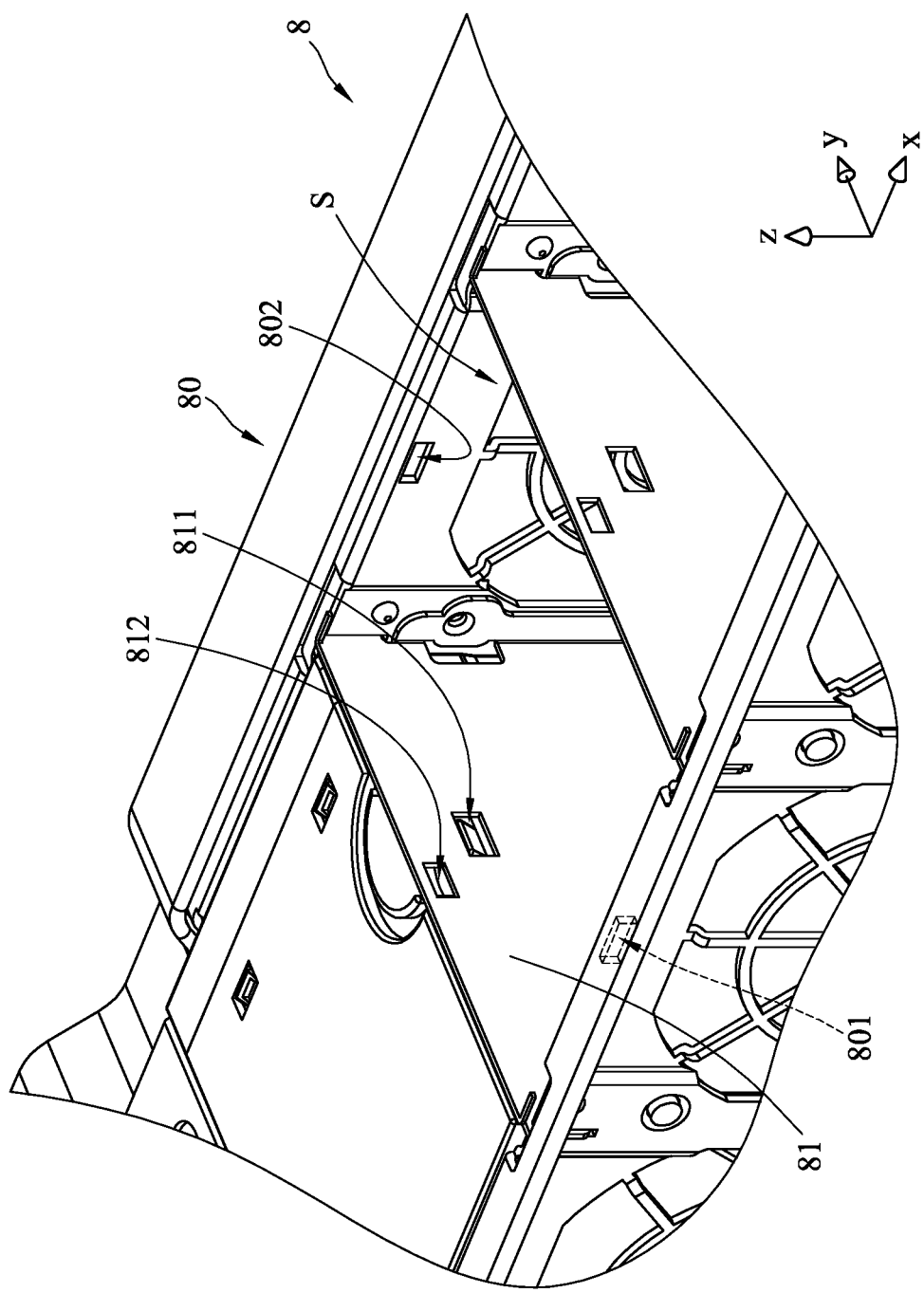
FIG. 2 is a partially enlarged perspective view of the carrier in FIG. 1.

Please further refer to FIGS. 2-6, in this embodiment, the carrier 8 provides one or more through holes at different sides of each accommodation space S. In specific, as shown in FIG. 2, the carrier body 80 of the carrier 8 has an engagement hole 801 and an engagement hole 802 at two opposite sides of each accommodation space S, and the partition boards 81 at the other two opposite sides of each accommodation space S respectively have an engagement hole 811 and an engagement hole 812, such that the fan cage 1 can be fixed to the carrier 8 in all directions.

Figure 3:
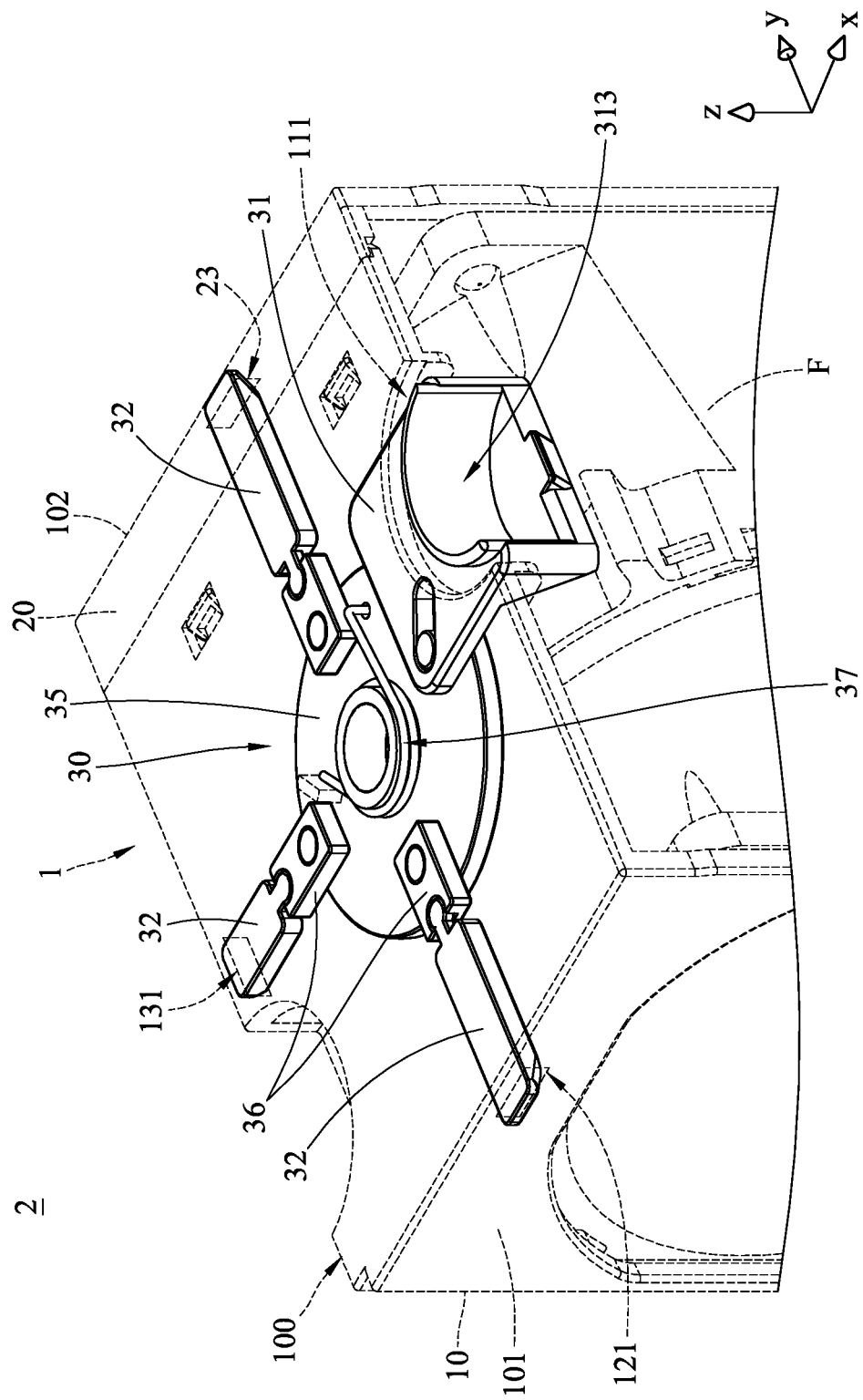
FIG. 3 is a partially enlarged perspective bottom view of one of the fan sets in FIG. 1.
Figure 4:
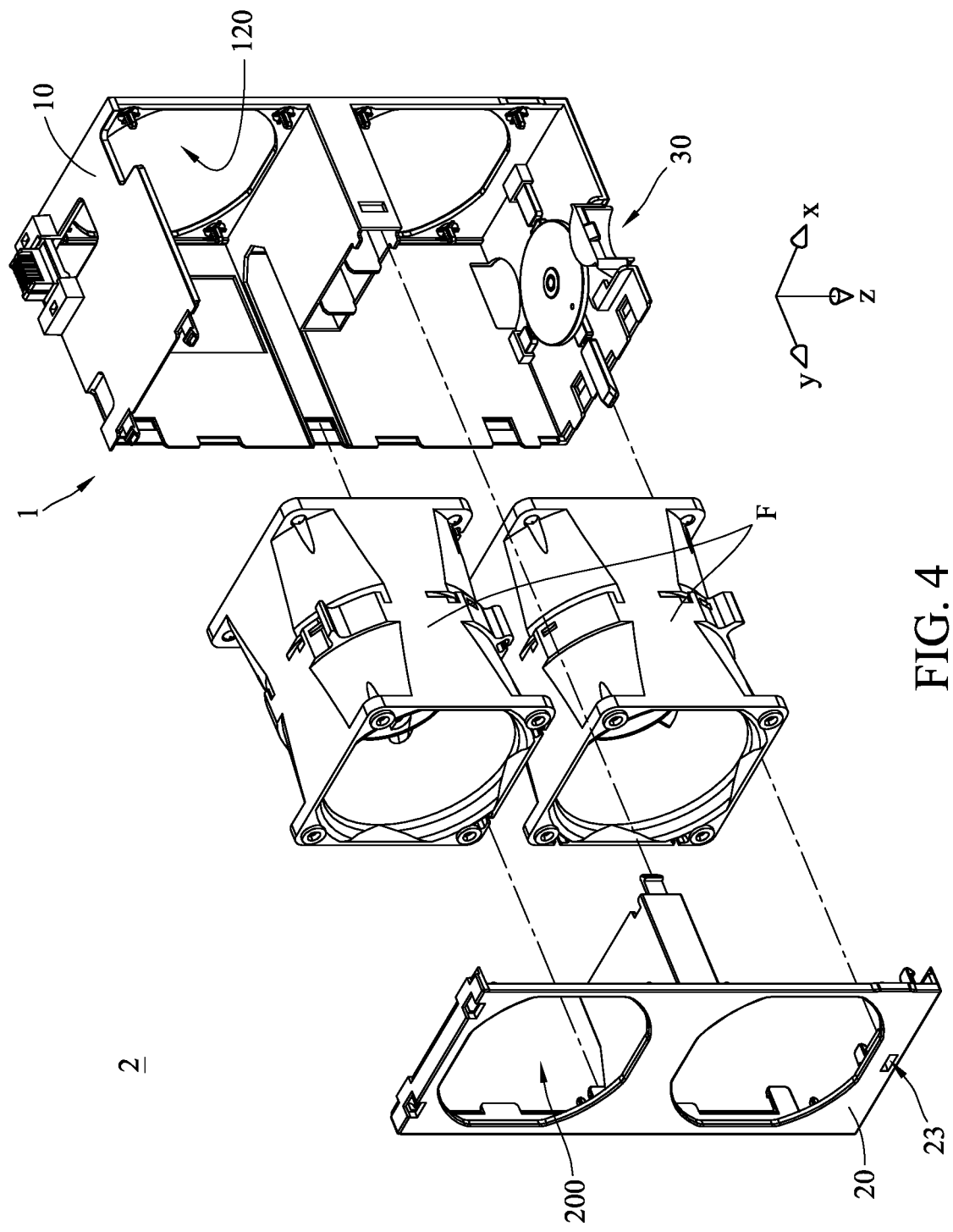
FIG. 4 is an exploded view of one fan set and fans.
Figure 5:
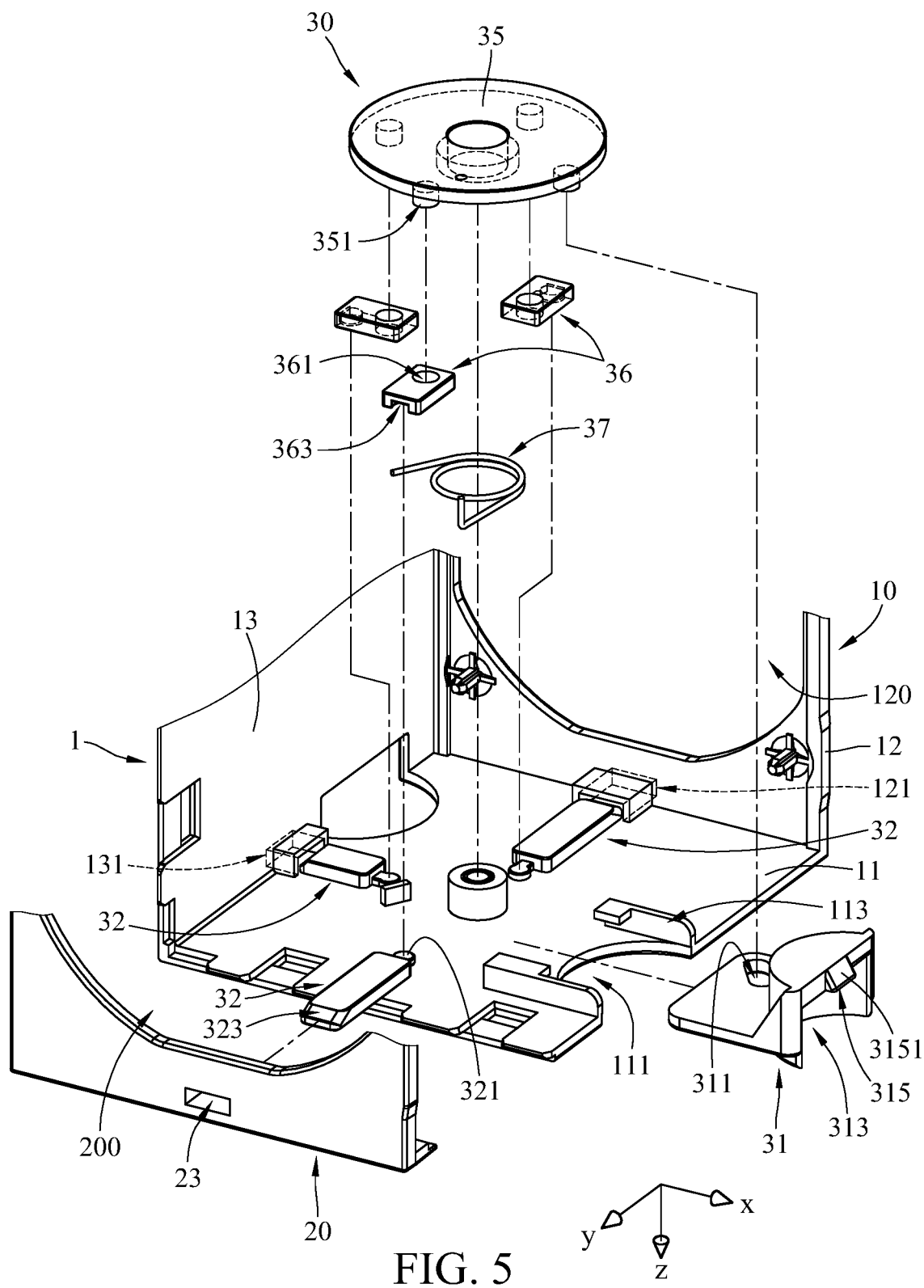
FIG. 5 is an exploded view of a fan cage in FIG. 4.

In detail, as shown in FIGS. 3-5, in this embodiment, the fan cage 1 may include a first cage part 10, a second cage part 20, and a latching mechanism 30. The second cage part 20 is removably or detachably installed at one side of the first cage part 10 in any suitable manner, such that the first cage part 10 and the second cage part 20 can be assembled to become a cage body 100 configured for accommodating an array of fans F. The latching mechanism 30 may be arranged at an inner side of the first cage part 10. For example, the latching mechanism 30 may be arranged in a narrow space between an inner surface of the first cage part 10 and one of the fans F. The latching mechanism 30 is able to releasably engaged with the engagement holes 801, 802, 811, and 812 of the carrier 8. In addition, the cage body 100 may have two surfaces 101 and 102, the surfaces 101 and 102 are respectively located at two opposite sides of the cage body 100, at least one ventilation port 120 is arranged at the surface 101, and at least one ventilation port 200 is arranged at the surface 102. The ventilation port 120 and the ventilation port 200 are served as air channels for the fans F accommodated within the cage body 100.

In more detail, in this embodiment, the first cage part 10 may include a first plate portion 11, a second plate portion 12, and a third plate portion 13, the second plate portion 12 and the third plate portion 13 are respectively located at adjacent sides of the first plate portion 11, the second cage part 20 is detachably arranged at another side of the first cage part 10 located opposite to the second plate portion 12. In this arrangement, the third plate portion 13 is connected to and located between the second plate portion 12 and the second cage part 20, and the second plate portion 12, the third plate portion 13, and the second cage part 20 are respectively arranged at different sides of the first plate portion 11. In one embodiment, when the fan cage 1 is placed in the carrier 8, the first plate portion 11 is exposed and reachable by user. The surface 101 and the ventilation port 120 are arranged at the second plate portion 12 of the first cage part 10. The surface 102 and the ventilation port 200 are arranged at the second cage part 20. The ventilation port 120 and the ventilation port 200 respectively correspond to an air inlet and an air outlet (not numbered) of the respective fan F.

In this embodiment, the latching mechanism 30 may be arranged at the inner side of the first plate portion 11 and may be located between the first plate portion 11 and the fan F. Thus, as shown, the latching mechanism 30 is general in a flat shape. In specific, the latching mechanism 30 may include a latch 31, a plurality of latches 32, a first link component 35, a plurality of second link components 36, and an elastic component 37 which are movably located at the first plate portion 11 and movably by each other.

Generally, the first link component 35 is rotatably disposed at the first plate portion 11; the second link components 36 and the latch 31 are respectively movably connected to different sides of the first link component 35 and therefore are movable with the first link component 35; the latches 32 are respectively movably connected to the second link components 36 and therefore are movable with the second link components 36; each of the latches 31 and 32 is partially protruding out of the outer surfaces of the cage body 100 so that the latches 31 and 32 are able to be removably inserted into or engaged with the engagement holes 801, 802, 811, and 812 of the carrier 8; and the elastic component 37 is connected to the first link component 35 and the first plate portion 11 and is served to restore the first link component 35 to its normal position. As such, all of the latches 31 and 32 are able to be engaged with the carrier 8 or released from the carrier 8 by selectively moving one of the latches 31 and 32.

In detail, there may be a plurality of installing portions 351 protruding from different sides of one surface of the first link component 35. As shown, the installing portions 351 protrude outwardly from a surface of the first link component 35 facing toward the first plate portion 11, and the installing portions 351 respectively correspond to the second plate portion 12, the third plate portion 13, the second cage part 20, and a side opposite to the third plate portion 13. The elastic component 37 may be but not limited to be any suitable torsion spring, two opposite ends of the elastic component 37 are respectively fixed to the first plate portion 11 and the first link component 35 so as to restore the first link component 35 to its normal position.

The second link components 36 may each have an installing portion 361, the installing portion 351 of the first link component 35 is rotatably inserted into the installing portion 361, thus, the second link components 36 are respectively rotatably disposed at different sides of the first link component 35. In other embodiments, the installing portion 351 of the first link component 35 may be a hole, and the installing portion 361 of the second link component 36 may be a protrusion rotatably inserted into the hole.

The latch 31 may have an installing portion 311, the installing portion 311 may be a groove suitable for the insertion of one of the installing portions 351 of the first link component 35, such that the installing portion 351 is rotatable and slidable in the installing portion 311. The latch 31 may have an operation portion 313 being exposed from the first plate portion 11 and reachable by user, such that the user is able to operate the latching mechanism 30 through the operation portion 313; specifically, the first plate portion 11 may have a hole 111 exposing the operation portion 313 of the latch 31. Thus, the user is allowed to operate the first link component 35 and other components connected to the first link component 35 by using finger to move the latch 31. Optionally, the latch 31 may further have a latching protrusion 315, the latching protrusion 315 sticks out of the cage body 100 when the elastic component 37 restores the first link component 35 to its normal position, the latching protrusion 315 is configured to be inserted into the engagement hole 811 of the partition board 81. In addition, in this embodiment, there is a rail 113 arranged at the inner surface of the first plate portion 11 for guiding the movement of the latch 31 in a specific path.

The second link components 36 may each have an installing portion 363, the installing portions 363 are respectively connected to the latches 32. Correspondingly, the latches 32 may each have an installing portion 321. The installing portions 321 are respectively movably connected to the installing portions 363. In this embodiment, one of the installing portion 363 and the installing portion 321 may be a recess, and the other one of the installing portion 363 and the installing portion 321 may be a ball-shaped joint rotatably located in the recess. When the second link components 36 are moved, the latches 32 can respectively be retractable with respect to the second plate portion 12, the third plate portion 13, and the second cage part 20.

In this embodiment, the second plate portion 12 may have a through hole 121 penetrating through the surface 101 and located at a side of the ventilation port 120; the third plate portion 13 may have a through hole 131; and the second cage part 20 may have a through hole 23 penetrating through the surface 102 and located at a side of the ventilation port 200. The through hole 121, the through hole 131, and the through hole 23 respectively correspond to the engagement holes 801, 812, and 802 at different sides of the accommodation space S. The latches 32 are retractably disposed through the through holes 23, 121, and 131 and therefore are able to be removably inserted into the engagement holes 801, 812, and 802.

In detail, when the first link component 35 is in its normal position by the elastic component 37, the latching protrusion 315 of the latch 31 and part of each latches 32 protrude outwardly from the outer surface of the cage body 100, such that the latches 31 and 32 which are respectively located at different sides of the latching mechanism 30 are able to be respectively engaged with the engagement holes 811, 802, 812, and 801 at different sides of the carrier 8, thereby securing the installation of the fan set 2 within the carrier 8.

The fan set 2 can be installed into the carrier 8 as depicted in FIG. 1. To this end, in this embodiment, the latching protrusion 315 of the latch 31 may have an inclined contact surface 3151, and the distal end of each latch 32 may have an inclined contact surface 323. During the placement of the fan cage 1 into the carrier 8, the carrier body 80 and the partition boards 81 respectively contact and push the inclined contact surface 3151 and the inclined contact surfaces 323 so as to cause the latches 31 and 32 to move inwardly, such that the latches 31 and 32 are prevented from interfering with the placement of the fan cage 1. The elastic component 37 is deformed by the movements of the latches 31 and 32 and stores elastic energy. As the latches 31 and 32 reach the engagement holes 801, 802, 811, and 812, the elastic component 37 is released to cause the latches 31 and 32 to insert into the engagement holes 801, 802, 811, and 812, such that different sides of the fan cage 1 are engaged with different sides of the accommodation space S.

Figure 6:
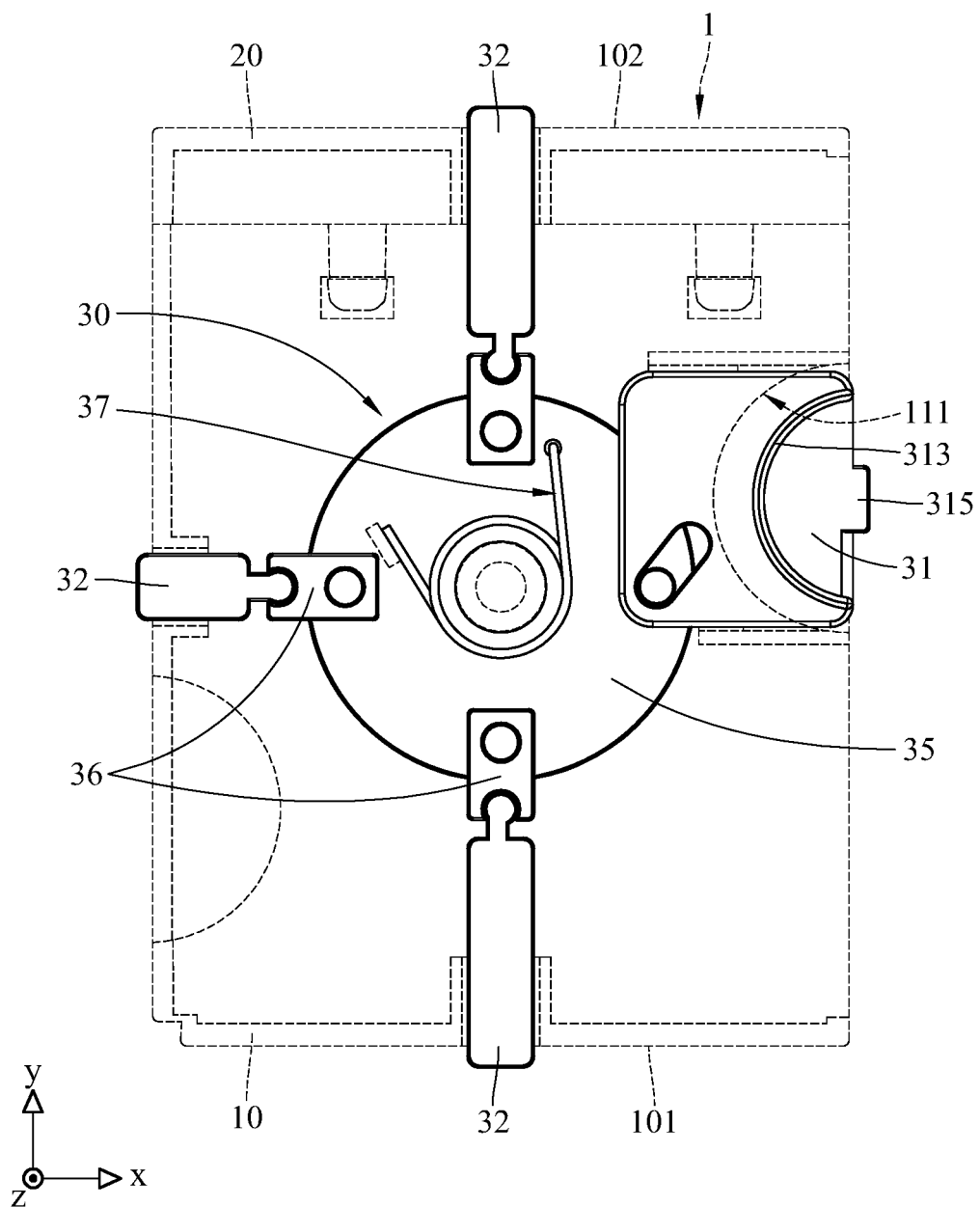
FIG. 6 is a top view of the fan cage.
Figure 7:
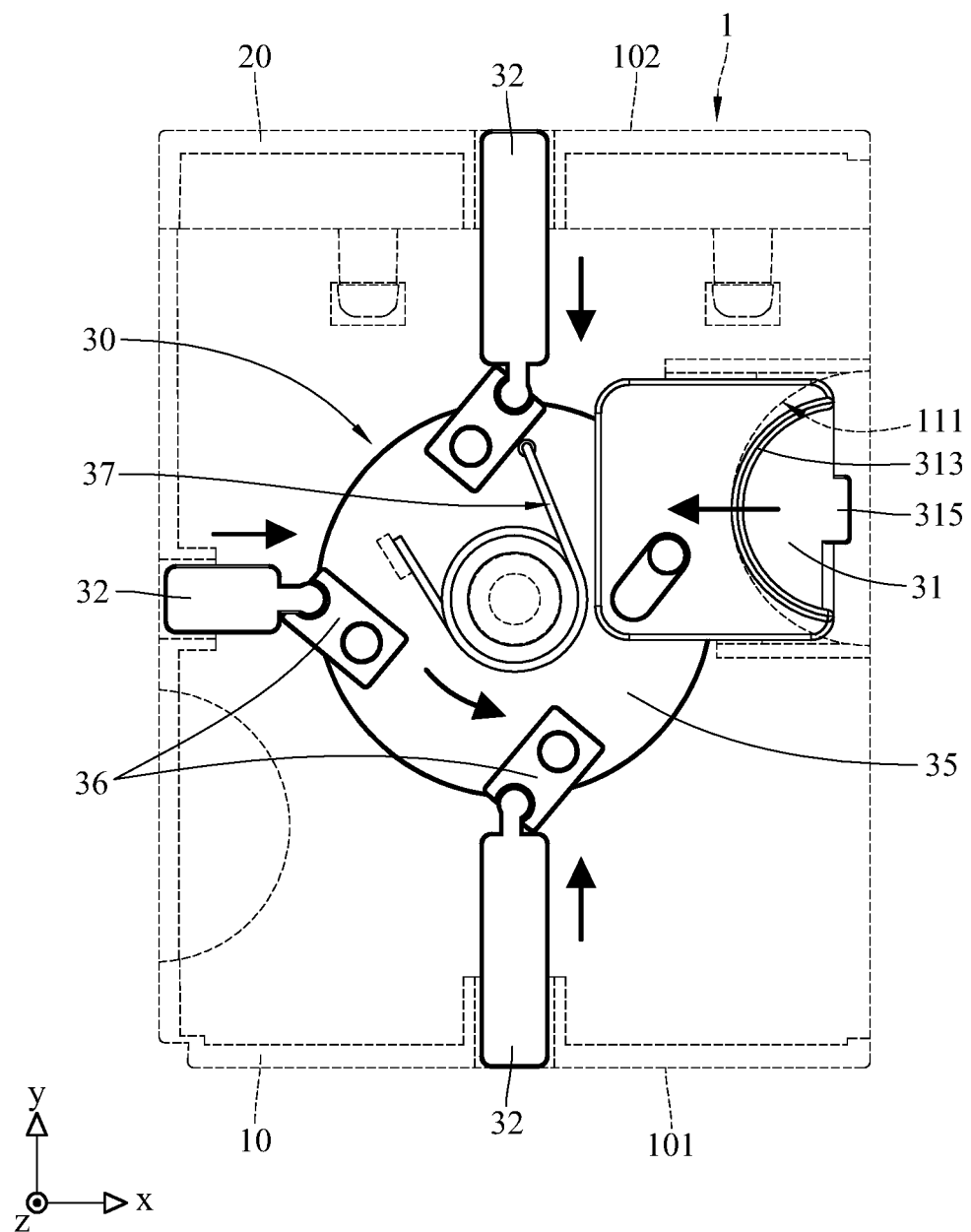
FIG. 7 is a top view showing the operation of the fan cage.

Specifically, please refer to FIGS. 1 and 6 and further refer to FIG. 7, when the operation portion 313 is pushed inwardly (as indicated by the arrow) or when the carrier body 80 and the partition board 81 push the latches 31 and 32 inwardly during the placement of the fan cage 1 into the accommodation space S of the carrier 8, at least the external force applied to the latch 31 can cause the latches 32, the first link component 35, and the second link components 36 to move, thereby retracting the latches 31 and 32 into the fan cage 1 (as indicated by the arrows). The elastic component 37 is deformed and stores elastic energy during the movements of the latches 31 and 32. When the latches 31 and 32 reach the engagement holes 801, 802, 811, and 812, the elastic component 37 can be released to cause the first link component 35 to rotate so as to cause the latch 31, the second link components 36, and the latches 32 to go back to the status as shown in FIG. 6, causing the latches 31 and 32 to stick out of the fan cage 1 and therefore to engage with the engagement holes 801, 802, 811, and 812. It is understood that pushing the latch 31 as indicated by the arrow in FIG. 7 to disengage the latching mechanism 30 from the carrier 8 will allow the user to take the fan cage 1 out of the carrier 8.

As discussed, the latching mechanism 30 is able to build connections at different sides of the fan cage 1 to the carrier 8 so as to ensure that the fan cage 1 is firmly installed in the carrier 8, such that the fans F are prevented from loosening or displacing away from their predetermined positions due to vibration or external force or impact.

Also, to prevent the latching mechanisms 30 of the fan cages 1 located at opposite sides of the partition board 81 from having interference, the engagement hole 811 and the engagement hole 812 are not aligned with each other, as shown in FIG. 2, the engagement hole 811 and the engagement hole 812 are spaced by different distances from an edge of the partition board 81. Thus, it is understood that the latching protrusion 315 of the latch 31 is not aligned with the latch 32 that is located opposite to the latch 31; in other words, the latching protrusion 315 is not aligned with the part of the latch 32 protruding through the partition board 81, such that the latch 31 of the fan cage 1 is prevented from interfering with the latch 32 of the adjacent fan cage 1.

In addition, generally, the space near the second plate portion 12 and the second cage part 20 are relatively wide compared to the other sides of the fan cage 1, which allows the latches 32 to have a longer part sticking out the through hole 121 of the second plate portion 12 and the through hole 23 of the second cage part 20; in other words, the latches 32 that are arranged at the surfaces 101 and 102 of the cage body 100 can stick a longer length from the outer surfaces of the cage body 100 and inserted into the engagement holes 801 and 802 of the carrier 8, thereby securing the engagement between the latching mechanism 30 and the carrier 8.

Figure 8:
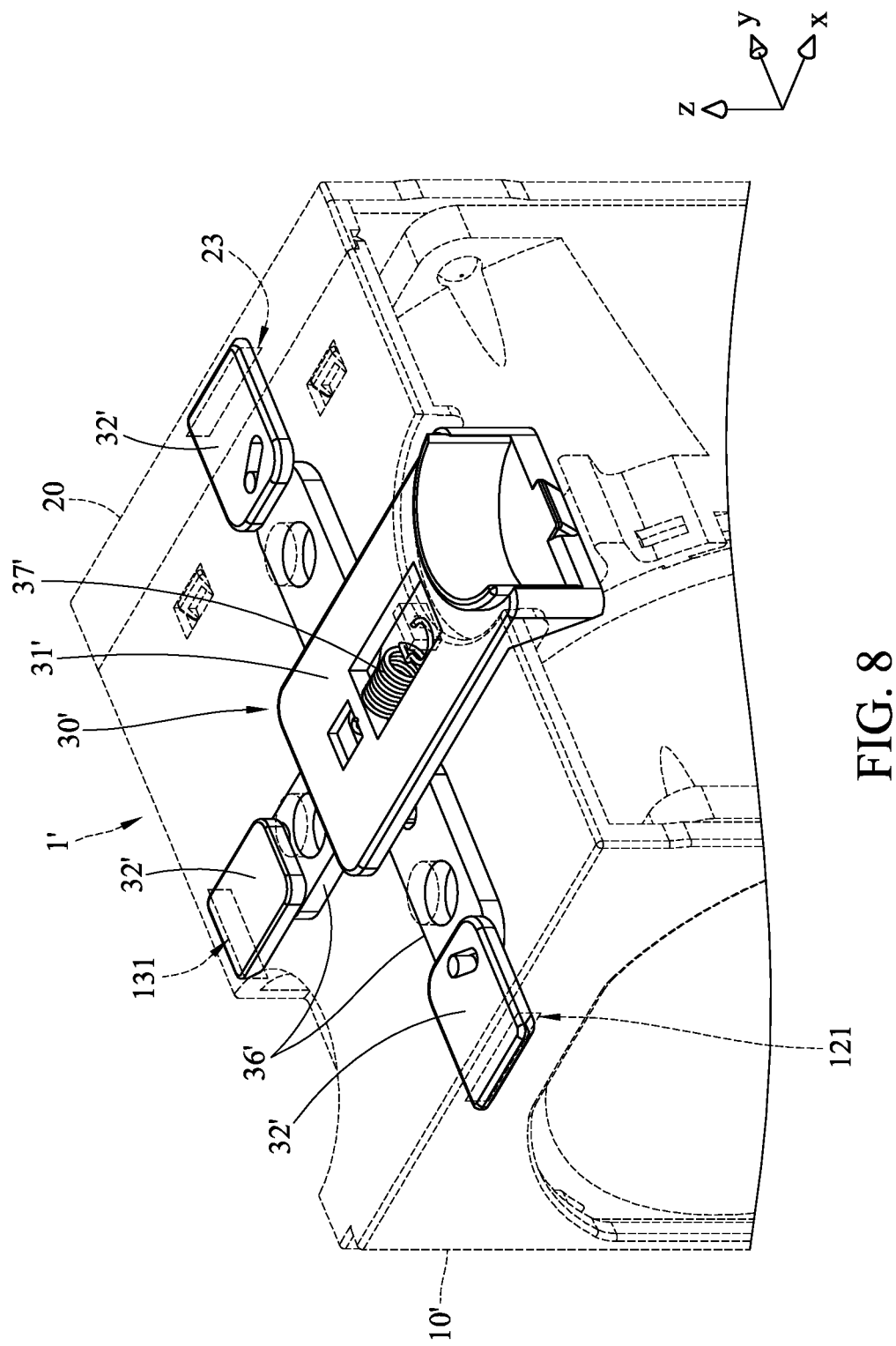
FIG. 8 is a perspective view of a fan cage according to another embodiment of the disclosure.

It is noted that the aforementioned latching mechanism 30 is exemplary but not intended to limit the disclosure, and the person having ordinary skills in the art would be able to modify or adjust the latching mechanism as required according to the basic spirit of the latching mechanism. For example, please refer to FIGS. 8-10, another embodiment of the disclosure provides a fan cage 1', but for the purpose of simplicity, only the differences between the previous and following embodiments will be provided in detail, the similar and same part thereof will be omitted.

Figure 9:
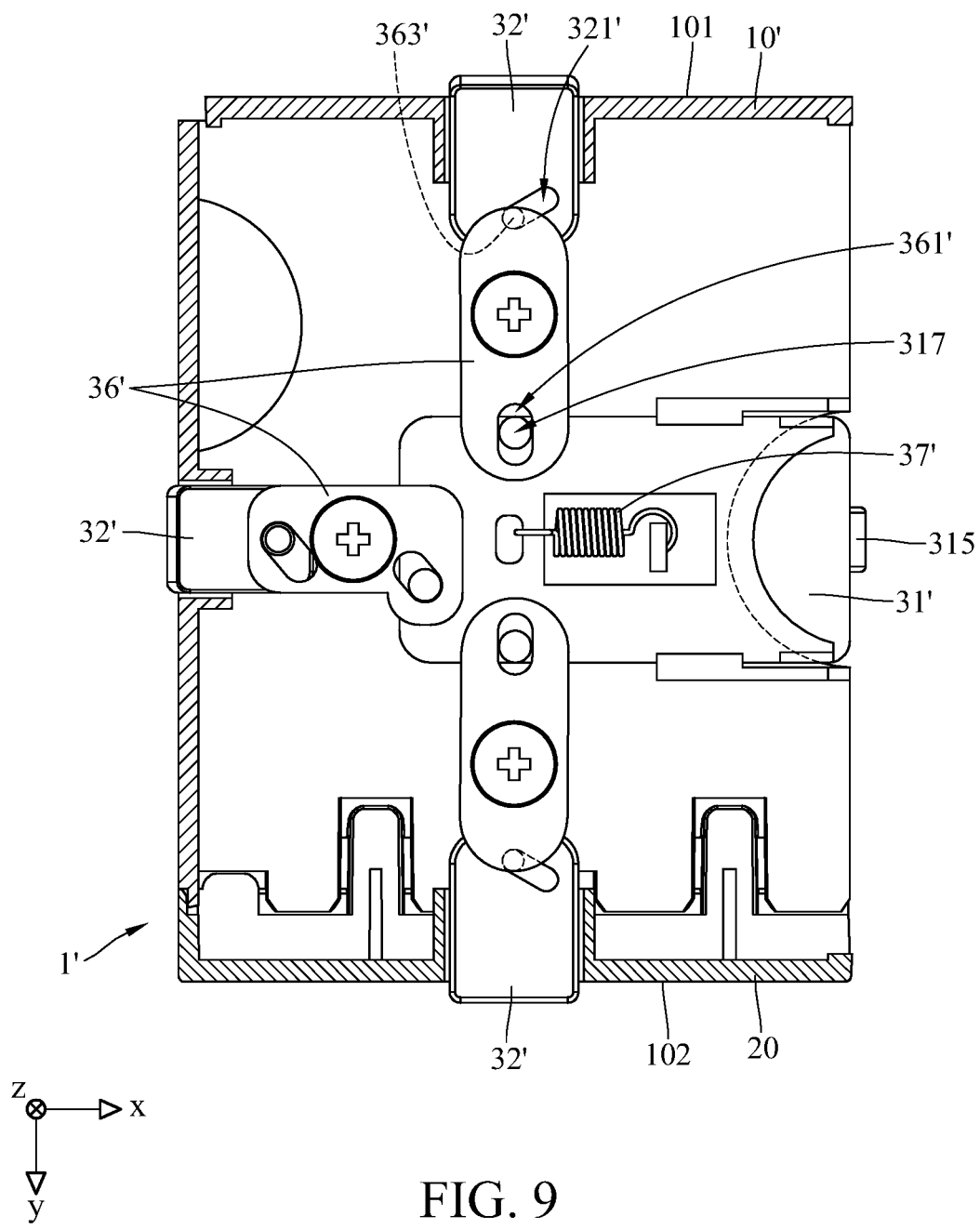
FIG. 9 is a top view of the fan cage in FIG. 8.
Figure 10:
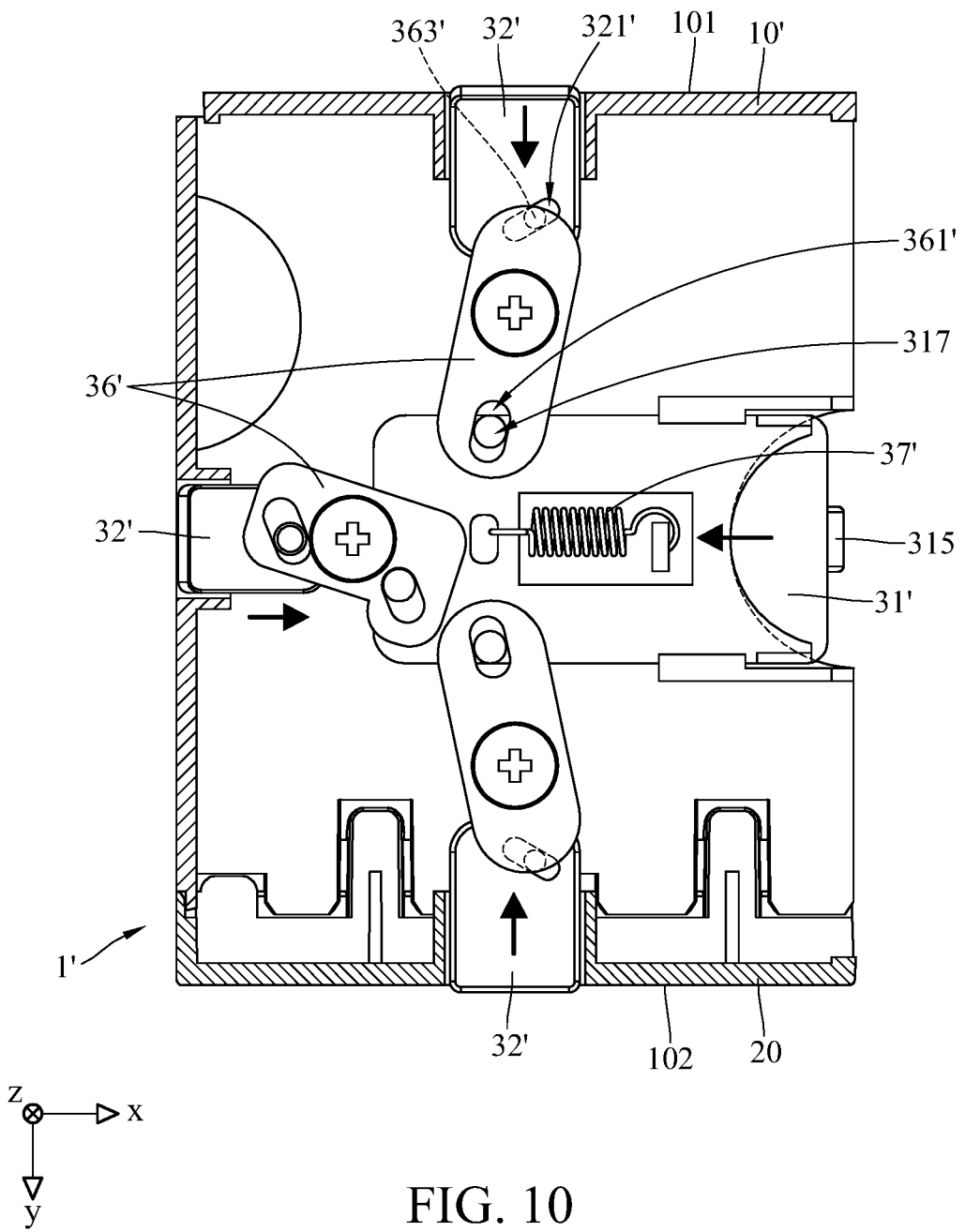
FIG. 10 is a top view showing the operation of the fan cage in FIG. 8.

As shown, the fan cage 1' has a latching mechanism 30' having a latch 31' directly connected to second link components 36', such that the latch 31' is able to cause latches 32' to move by directly moving the second link components 36'. In detail, there are a plurality of installing portions 317 arranged at different sides of a surface of the latch 31', one of the installing portion 317 and an installing portion 361' of the second link component 36' is a groove, and the other one of the installing portion 317 and the installing portion 361' is a protrusion slidable and rotatable in the groove; one of the installing portion 361' of the second link component 36' and an installing portion 321' of one of the latches 32' is an inclined groove, the other one of the installing portion 361' and the installing portion 321' is a protrusion slidable and rotatable in inclined groove; there is an elastic component 37' being a spring suitable for forcing the latching protrusion 315 of the latch 31' to protrude outwardly the outer surface of the fan cage 1'. For example, the elastic component 37' is an extension spring. In such an arrangement, as shown in FIGS. 9-10, the latches 31' and 32' can be moved together by moving the latch 31' (as indicated by the arrows). As the latch 31' is released, the elastic component 37' can restore the latch 31' back to its normal position, and the movement of the latch 31' can move the latches 32' back to their normal positions as well.

It is noted that the number of the latches in one latching mechanism is exemplary but not intended to limit the disclosure. In some other embodiments, one side of the cage body may have any required number of latches as required. In one embodiment, one or more than one side of the cage body may be absent of the aforementioned latches. For example, the latching mechanism only provides one latch at the side of the fan cage having the ventilation port. Correspondingly, the numbers and positions of the through holes on the cage body and the engagement holes on the carrier may be modified according to the arrangement of the latches.

According to the fan cage, the fan module, and the electronic device as discussed in the above embodiments of the disclosure, the latching mechanism provides at least one latch configured to engage at least one side of the cage body of the fan cage with the carrier, thus the fan cage can have a firm connection with the carrier, such that the fan cage is prevented from loosening and displacing away from the predetermined position due to vibration or external force or impact while accommodating more than one fan.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fan cage comprising:
   a cage body having two surfaces and at least two ventilation ports, wherein the two surfaces are located opposite to each other, and the two ventilation ports are respectively located at the two surfaces; and
   a latching mechanism arranged at the cage body and comprising at least one latch, wherein the at least one latch is movably protruding outwardly from one of the two surfaces.

2. The fan cage according to claim 1, wherein the latching mechanism is located at an inner surface of the cage body, the cage body has a hole exposing the at least one latch.

3. The fan cage according to claim 2, wherein the latching mechanism further comprises a first link component and an elastic component, the first link component is rotatably disposed on the cage body, the elastic component is connected to the cage body and the first link component, and the at least one latch is movably connected to the first link component and is movable with the first link component.

4. The fan cage according to claim 3, wherein the cage body further comprises a plurality of through holes, the at least one latch of the latching mechanism comprises a plurality of latches, the plurality of latches are respectively movably connected to different sides of the first link component and are respectively movably disposed through the plurality of through holes of the cage body.

5. The fan cage according to claim 4, wherein the latching mechanism further comprises a plurality of second link components, a part of the plurality of latches are respectively movably connected to the plurality of second link components and are connected to the first link component via the plurality of second link components.

6. The fan cage according to claim 4, wherein parts of two of the plurality of latches located opposite to each other sticking out of the cage body are not aligned with each other.

7. The fan cage according to claim 2, wherein the latching mechanism further comprises an elastic component connected to the cage body and the at least one latch.

8. The fan cage according to claim 7, wherein the cage body comprises a plurality of through holes, the latching mechanism comprises a plurality of second link components, the at least one latch comprises a plurality of latches, different sides of one of the plurality of latches are respectively movably connected to others of the plurality of latches via the plurality of second link components, the plurality of latches are respectively movably disposed through the plurality of through holes of the cage body.

9. The fan cage according to 8, wherein parts of two of the plurality of latches located opposite to each other sticking out of the cage body are not aligned with each other.

10. The fan cage according to claim 1, wherein the at least one latch having an inclined contact surface protruding out of the cage body.

11. The fan cage according to claim 1, wherein the cage body is configured for accommodating at least one fan, and the latching mechanism is configured to be arranged between the cage body and the at least one fan.

12. A fan module, adapted for accommodating at least one fan, comprising:
a carrier comprising a cage body and a plurality of partition boards, wherein the plurality of partition boards are located in the cage body so as to define a plurality of accommodation spaces; and
a plurality of fan cages respectively removably accommodated in the plurality of accommodation spaces, wherein the plurality of fan cages are respectively configured for accommodating the at least one fan, and each of the plurality of fan cages comprising:
a cage body having two surfaces and at least two ventilation ports, wherein the two surfaces are located opposite to each other, the two ventilation ports are respectively located at the two surfaces and are configured to correspond to the at least one fan; and
a latching mechanism arranged at the cage body and comprising at least one latch, wherein the at least one latch is movably protruding outwardly from one of the two surfaces.

13. The fan module according to claim 12, wherein the latching mechanism is located at an inner surface of the cage body, the cage body has a hole exposing the at least one latch.

14. The fan module according to claim 12, wherein the carrier comprises at least one engagement hole arranged at at least one of the cage body and the plurality of partition boards, and the at least one latch is removably disposed through the at least one engagement hole so as to be engageable with the carrier.

15. The fan module according to claim 14, wherein the latching mechanism further comprises a first link component and an elastic component, the first link component is rotatably disposed on the cage body, the elastic component is connected to the cage body and the first link component, and the at least one latch is movably connected to the first link component and is movable with the first link component.

16. The fan module according to claim 15, wherein the at least one engagement hole comprises a plurality of engagement holes respectively arranged at the cage body and each of the plurality of partition boards, each of the cage bodies comprises a plurality of through holes, the plurality of through holes respectively correspond to the plurality of engagement holes on the cage body and the plurality of partition boards; the at least one latch of each of the latching mechanisms comprises a plurality of latches respectively movably connected to different sides of the first link component; the plurality of latches are respectively movably disposed through the plurality of through holes of the cage body so as to respectively be removably engaged with the plurality of engagement holes of the carrier.

17. The fan module according to claim 16, wherein each of the latching mechanisms further comprises a plurality of second link components; in each of the latching mechanisms, a part of the plurality of latches are respectively movably connected to the plurality of second link components and are connected to the first link component via the plurality of second link components.

18. The fan module according to claim 16, wherein parts of two of the plurality of latches located opposite to each other sticking out of the cage body are not aligned with each other.

19. The fan module according to claim 14, wherein each of the latching mechanisms further comprises an elastic component connected to the cage body and the at least one latch.

20. The fan module according to claim 19, wherein the at least one engagement hole comprises a plurality of engagement holes respectively arranged at the cage body and the plurality of partition boards, each of the cage bodies comprises a plurality of through holes, the plurality of through holes respectively correspond to the plurality of engagement holes on the cage body and the plurality of partition boards; the at least one latch comprises a plurality of latches, each of the latching mechanisms comprises a plurality of second link components, different sides of one of the plurality of latches are respectively movably connected to others of the plurality of latches via the plurality of second link components, the plurality of latches are respectively movably disposed through the plurality of through holes of the cage body and the plurality of engagement holes of the carrier.

21. The fan module according to claim 20, wherein parts of two of the plurality of latches located opposite to each other sticking out of the cage body are not aligned with each other.

22. The fan module according to claim 12, wherein the at least one latch having an inclined contact surface protruding out of the cage body and configured to contact the cage body or one of the plurality of partition boards.

23. An electronic device, adapted for accommodating at least one fan, comprising:
a casing; and
a fan module, comprising:
a carrier comprising a cage body, a plurality of partition boards, and at least one engagement hole, wherein the cage body is removably accommodated in the casing, the plurality of partition boards are located in the cage body so as to define a plurality of accommodation spaces, the at least one engagement hole are arranged at at least one of the cage body and the plurality of partition boards; and
a plurality of fan cages respectively removably accommodated in the plurality of accommodation spaces, wherein the plurality of fan cages are respectively configured for accommodating the at least one fan, and each of the plurality of fan cages comprising:
a cage body having two surfaces and at least two ventilation ports, wherein the two surfaces are located opposite to each other, the two ventilation ports are respectively located at the two surfaces and are configured to correspond to the at least one fan; and
a latching mechanism arranged at the cage body and comprising at least one latch, wherein the at least one latch is movably protruding outwardly from one of the two surfaces and removably engaged with the at least one engagement hole.

* * * * *